(12) United States Patent
Bonilla et al.

(10) Patent No.: US 7,629,264 B2
(45) Date of Patent: Dec. 8, 2009

(54) STRUCTURE AND METHOD FOR HYBRID TUNGSTEN COPPER METAL CONTACT

(75) Inventors: Griselda Bonilla, Fishkill, NY (US); Kaushik A. Kumar, Poughkeepsie, NY (US); Lawrence A. Clevenger, LaGrangeville, NY (US); Stephan Grunow, Poughkeepsie, NY (US); Kevin S. Petrarca, Newburgh, NY (US); Roger A. Quon, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/099,996

(22) Filed: Apr. 9, 2008

(65) Prior Publication Data
US 2009/0256263 A1 Oct. 15, 2009

(51) Int. Cl.
H01L 21/302 (2006.01)
(52) U.S. Cl. ............ 438/739; 438/629; 438/735; 257/774; 257/E21.585; 257/E23.145; 257/E23.151
(58) Field of Classification Search .......... 438/629, 438/735, 739, 745, 758; 257/774, E21.585, 257/E23.145, E23.151, E23.175
See application file for complete search history.

(56) References Cited

U.S. PATENT DOCUMENTS

| | | | |
|---|---|---|---|
| 4,942,076 A | 7/1990 | Panicker et al. | |
| 5,752,182 A | 5/1998 | Nakatsuka et al. | |
| 5,866,483 A * | 2/1999 | Shiau et al. | 438/720 |
| 5,897,728 A | 4/1999 | Cole et al. | |
| 5,940,279 A | 8/1999 | Gademann et al. | |
| 6,159,842 A | 12/2000 | Chang et al. | |
| 6,384,481 B1 * | 5/2002 | Hussein et al. | 257/750 |
| 6,492,271 B1 * | 12/2002 | Uozumi et al. | 438/689 |
| 6,617,173 B1 * | 9/2003 | Sneh | 438/3 |
| 6,630,395 B1 * | 10/2003 | Kane et al. | 438/622 |
| 6,677,680 B2 | 1/2004 | Gates et al. | |
| 6,843,902 B1 | 1/2005 | Penner et al. | |
| 7,115,999 B2 * | 10/2006 | Tsumura et al. | 257/774 |
| 7,144,827 B2 | 12/2006 | Rantala et al. | |
| 2005/0093108 A1 * | 5/2005 | Chang | 257/635 |
| 2005/0167843 A1 * | 8/2005 | Ishida et al. | 257/758 |
| 2007/0249158 A1 * | 10/2007 | Okayama et al. | 438/629 |

* cited by examiner

Primary Examiner—Minh-Loan T Tran
Assistant Examiner—Yu-Hsi Sun
(74) Attorney, Agent, or Firm—Scully, Scott, Murphy & Presser, P.C.; Wenjie Li, Esq.

(57) ABSTRACT

The present invention in one embodiment provides a method of forming an interconnect comprising, providing a interlevel dielectric layer atop a substrate, the interlevel dielectric layer including at least one tungsten (W) stud extending from an upper surface of the interlevel dielectric to the substrate; recessing an upper surface of the at least one tungsten (W) stud below the upper surface of the interlevel dielectric to provide at least one recessed tungsten (W) stud; forming a first low-k dielectric layer atop the upper surface of the interlevel dielectric layer and the at least one recessed tungsten (W) stud; forming a opening through the first low-k dielectric layer to expose an upper surface of the at least one recessed tungsten stud; and filling the opening with copper (Cu).

19 Claims, 3 Drawing Sheets

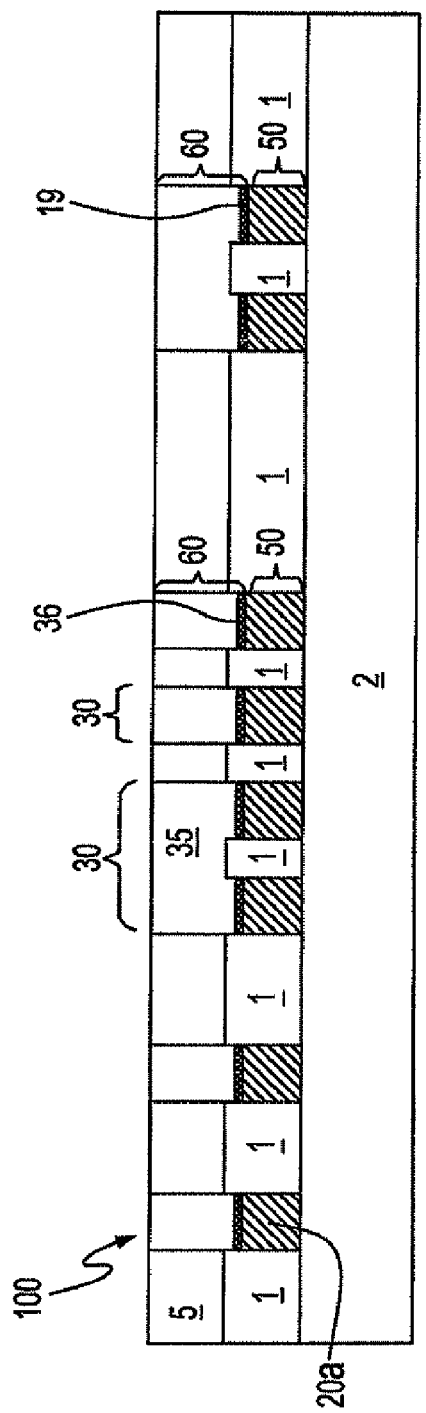
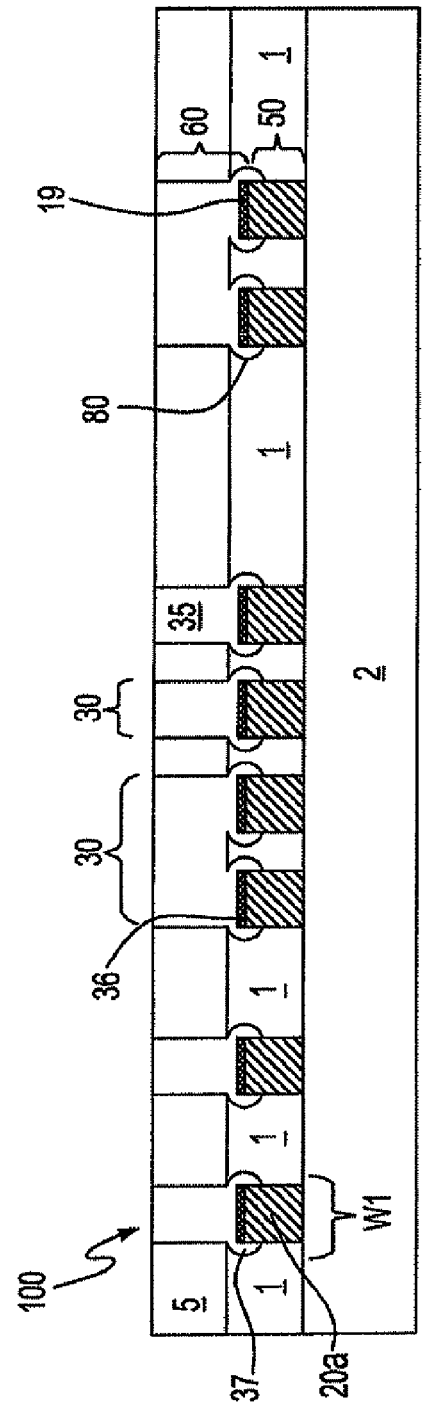

STRUCTURE AND METHOD FOR HYBRID TUNGSTEN COPPER METAL CONTACT

FIELD OF THE INVENTION

In one embodiment, the present invention relates to contacts to electrical devices.

BACKGROUND OF THE INVENTION

The demand for high density and performance associated with ultra large-scale integration semiconductor wiring requires responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped silicon, and a plurality of sequentially formed interlayer dielectrics and interconnected metallization layers defining conductive patterns. An integrated circuit is typically formed of a plurality of conductive patterns including conductive lines separated by interwiring insulator, and a plurality of interconnect lines, such as bus lines, bit lines, word lines and logic interconnect lines. Typically, the conductive patterns that are positioned on different metallization layers, i.e., upper and lower metallization layers, are electrically connected by a conductive plug filling a via opening, while a conductive plug filling a contact opening establishes electrical contact with an active region on a semiconductor substrate, such as a source/drain region. Conductive lines are formed in trenches, which typically extend horizontally with respect to the semiconductor substrate.

A conductive plug filling a via opening is typically formed by depositing an interlayer dielectric on a conductive layer comprising at least one conductive pattern, forming an opening in the interlayer dielectric by conventional photolithographic and etching techniques, and filling the opening with a conductive material, such as tungsten (W). Excess conductive material on the surface of the interlayer dielectric is removed by chemical-mechanical polishing. One such method of forming an interconnect structure is known as damascene and involves forming an opening and filling the opening with a metal. Dual damascene techniques involve forming an opening comprising a lower contact or via opening section in communication with an upper trench opening section, and filling the opening with a conductive material, typically a metal, to simultaneously form a conductive plug in electrical contact with a conductive line.

High performance microprocessor applications require the rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Tungsten has been used as the interconnect between the devices (FEOL) of a semiconductor and the interconnects (BEOL) for many years. The tungsten is used as a barrier between them so as not to allow any of the BEOL materials to contaminate the FEOL devices thereby rendering them useless.

Copper (Cu) and copper (Cu)-alloys have received considerable attention as a replacement material for tungsten (W) in ultra large-scale interconnection metallization. Copper (Cu) is relatively inexpensive, easy to process, has a lower resistivity than tungsten (W), and has improved electrical properties in comparison to tungsten (W), making copper (Cu) a desirable metal for use as a conductive plug, as well as conductive wiring. However, due to copper's (Cu) diffusion through the inter-dielectric layer, copper (Cu) interconnect structures must be encapsulated by a diffusion barrier layer. Typical diffusion barriers include tantalum (Ta), tantalum nitride (TaN), titanium (Ti), titanium nitride (TiN), titanium-tungsten (TiW), and silicon nitride ($Si_3N_4$). The use of such barrier materials to encapsulate copper (Cu), is not limited to the interface between copper (Cu) and the interlayer dielectric, but includes interfaces with other metals as well.

SUMMARY OF THE INVENTION

The present invention in one aspect provides a method of forming an interconnect for microelectronics. In one embodiment, the method for forming the interconnect includes:

providing an interconnect dielectric layer atop a substrate, the interconnect dielectric layer including at least one tungsten (W) stud extending from an upper surface of the interconnect dielectric layer to the substrate;

recessing an upper surface of the at least one tungsten (W) stud below the upper surface of the interconnect dielectric layer to provide at least one recessed tungsten (W) stud;

forming a first low-k dielectric layer atop the upper surface of the interconnect dielectric layer and the at least one recessed tungsten (W) stud;

forming an opening through the first low-k dielectric layer to expose an upper surface of the at least one recessed tungsten (W) stud; and filling the opening with copper (Cu).

In one embodiment, the tungsten (W) stud further includes a titanium (Ti) layer atop the substrate, and a titanium nitride (TiN) layer atop the titanium (Ti) layer, wherein the remainder of the stud is composed of a tungsten layer (W), which is formed atop the titanium nitride (TiN) layer. In one embodiment, the interconnect dielectric layer is composed of silicon oxide ($SiO_2$), Boron Phosphor Silicate Glass (BPSG) oxide, fluorinated silicon oxide ($SiO_2$), silicon nitride ($Si_3N_4$), silicon carbide (SiC), silicon carbon hydride (SiCH), organosilicate glass (OSG), hydrogen silsesquioxane, methyl silsesquioxane, tetraethylorthosilicate (TEOS), silicon oxynitride ($SiO_xN_y$), or combinations thereof.

In an additional embodiment, the step of recessing the upper surface of the tungsten (W) stud includes recessing the tungsten (W) studs' upper surface to a depth ranging from about 1% to about 90% of the original tungsten (W) stud height. In one embodiment, the step of recessing the upper surface of the at least one tungsten (W) stud includes an anisotropic etch composed of a fluorinated species. In one embodiment, the anisotropic etch step includes reactive ion etch (RIE). In one embodiment, the fluorinated species is composed of $C_4F_8$, $C_5F_8$, $C_4F_6$, or $NF_3$. In another embodiment, the recessing of the upper surface of the at least one tungsten (W) metal stud comprises a wet etch. In one embodiment, the wet etch includes a chemistry composed of $H_2O_2$. In another embodiment, the wet etch may include a chemistry composed of persulfates.

In one embodiment, the step of forming the first low-k dielectric layer atop the upper surface of the interconnect dielectric layer and the at least one recessed tungsten (W) stud includes a deposition process. In one embodiment, the deposition process for forming the low-k dielectric layer comprises CVD, PECVD, PVD, high-density plasma CVD, IPVD, or spin-on glass process. In one embodiment, the low-k dielectric layer has a thickness ranging from about 10 nm to about 1000 nm. In one embodiment, the low-k dielectric layer includes a dielectric constant ranging from about 1.0 to about 3.0. In one embodiment, the low-k dielectric layer is non-porous. In another embodiment, the low-k dielectric layer is porous. In one embodiment, a first low-k dielectric layer comprises SiCOH or an aromatic hydrocarbon polymer composition, such as SILK™. In another embodiment, the first low-k dielectric layer comprises carbon-doped oxides.

In another embodiment, an insulator is deposited over the device layer, patterned and etched. In one embodiment, the tungsten and the liners that are employed are formed using deposition methods. In one embodiment, because the liners and the tungsten are deposited using conformal deposition methods, the materials may be deposited in a thin layer in a manner that does not completely fill the via. More specifically, in this embodiment, the conformally deposited tungsten and liner materials form a cup (also referred to as tungsten cup) within the opening, e.g., a via. Extraneous material is then removed from atop the insulating layer leaving the liner/tungsten in the via, which is hereafter referred to as the tungsten via layer. In a following process step, a clean step may be employed, which in one embodiment may include 300:1 HF in deionized water. A low-k material is then deposited on the tungsten via layer, which is then patterned and etched. The use of the low-k material allows for a difference in the etch rates between the low-k material and the insulator used in the tungsten via layer. In one embodiment, the low-k material etches at a faster rate than the insulator that is used in the tungsten via layer. In one embodiment, by utilizing this differential in etch rates, the low-k material that is deposited in the tungsten cup that resides in the via opening is cleared leaving only the tungsten open to the trench that is above it. In a following process step, a copper liner and seed are deposited followed by copper plating. The copper liner and seed material that is followed by copper planting fills the tungsten cup and the trench above it with the liner/cooper seed/plated copper. The extraneous material is polished away from the upper portion of the low-k material in a process step that may include chemical mechanical polishing. In one embodiment, insulating material(s) is (are) deposited over the device layer. This insulating layer is then patterned, etched and filled to form the tungsten (W) studs over the device layer. The tungsten (W) studs are then recessed. A subsequent insulating material (s), preferably a lower-k dielectric, is then deposited atop the layer containing the recessed tungsten (W) stud(s). The insulating films may have topography resulting from the recessed tungsten (W) stud(s).

In one embodiment, the step of forming the via through the first low-k dielectric layer to expose the upper surface of the at least one recessed tungsten (W) stud includes photolithography and an etch process step. In one embodiment, a pattern is produced by applying a photoresist to the surface to be etched, exposing the photoresist to a pattern of radiation, and then developing the pattern into the photoresist utilizing a conventional resist developer. Once the patterning of the photoresist is completed, the sections covered by the photoresist are protected while the exposed regions are removed using a selective etching process that removes the unprotected regions to provide the via. In one embodiment, the method further includes an isotropic etch applied through the via to remove a portion of the interconnect dielectric layer selective to the low-k dielectric layer prior to the filling of the via with the copper (Cu).

In one embodiment, the step of filling the via with copper (Cu) includes physical vapor deposition (PVD). In one embodiment, the step of filling the via with copper (Cu) further includes depositing a layer of tantalum nitride (TaN) directly on the recessed tungsten (W) stud, depositing a layer of tantalum (Ta) directly on the tantalum nitride (TaN) layer, depositing a copper (Cu) seed layer directly on the tantalum nitride (TaN) layer, and then filling the via with copper (Cu). In one embodiment, deposition of the tantalum nitride (TaN) layer, the tantalum (Ta) layer, and/or the copper (Cu) seed layer is provided by physical vapor deposition (PVD), ionized physical vapor deposition (IPVD), atomic layer deposition (ALD) or a combination thereof. In one embodiment, the via is filled with copper (Cu) using electroplating, sputtering, or a combination thereof. In one embodiment, a planarization process follows filling of the via.

In another aspect of the present invention an interconnect structure is provided. In one embodiment, the interconnect structure includes:

a via extending through an interconnect dielectric layer; and a hybrid metal stud positioned in the via, the hybrid metal stud including an upper portion composed of copper (Cu) and a lower portion composed of tungsten (W).

In one embodiment the interconnect structure further includes a recess in a sidewall of the via, wherein the recess is positioned at an interface of the upper portion of hybrid metal stud and the lower portion of the hybrid metal stud, wherein an extension of copper (Cu) from the upper portion of the hybrid metal stud is positioned in the recess and contacts a sidewall of the lower portion of the hybrid metal stud.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIGS. 5 and 6 are side cross sectional views depicting one embodiment of depositing copper (Cu) within the via.

FIG. 7 is a side cross sectional view depicting a second embodiment of depositing copper within the via, wherein prior to deposition an isotropic etch is utilized to provide a recess in the sidewall of the via, in accordance with the present invention.

DETAILED DESCRIPTION OF THE INVENTION

Figure 1:
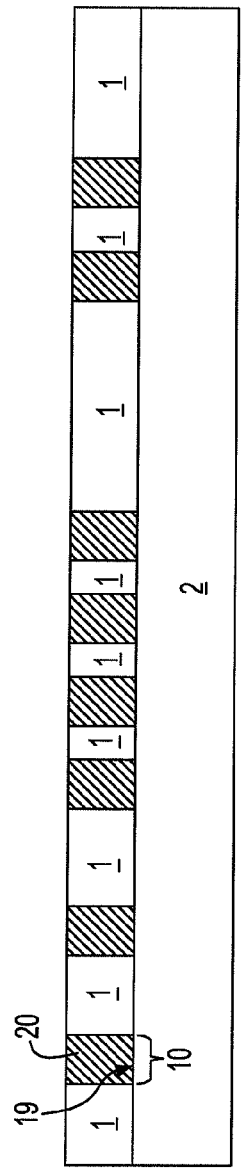
FIG. 1 is a side cross sectional view of an initial structure including a interconnect dielectric layer including tungsten (W) studs, as used in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming interconnects for microelectronics. When describing the methods, the following terms have the following meanings, unless otherwise indicated.

As used herein, an "anisotropic etch process" denotes a material removal process in which the etch rate in the direction normal to the surface to be etched is higher than in the direction parallel to the surface to be etched.

The term "isotropic etch process" means a material removal process in which the rate of the etching reaction is substantially the same in any direction.

As used herein, the terms "insulating" and/or "dielectric" denote a material having a room temperature conductivity of less than about $10^{10}$ $(\Omega\text{-m})^{-1}$.

A "low-k dielectric" means a dielectric material having a dielectric constant of about 3.9 or less.

The term "electrical contact" denotes direct physical contact between two materials, wherein the interface between the two materials is electrically conductive.

The term "hybrid metal stud" denotes an interconnect that is composed of at least two materials in a vertically layered orientation.

As used herein, an "interconnect" is an electrically conductive structure through a dielectric material.

As used herein, a "stud" refers to the metal formed within a via.

As used herein, a "metal" is an electrically conductive material.

As used herein, the term "opening" may include a trench or a via.

As used herein, a "via" refers to a hole formed in a dielectric which is then filled with metal to provide vertical connection between layered metal lines and/or devices.

"Electrically conductive" and/or "electrically communicating" as used through the present disclosure means a material typically having a room temperature conductivity of greater than $10^{-8}$ $(\Omega\text{-m})^{-1}$.

As used herein, a "barrier metal" is a material used to chemically isolate the phase change material from metals and provides an electrical contact between them.

As used herein, "diamond like carbon" is a carbon containing material having an amorphous grain structure and containing both $sp^2$ and $sp^3$ bonds.

The term "undercut region" denotes a structure resulting from material removal that extends underneath an overlying structure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1 to 6 depict embodiments of the present method for forming a hybrid metal stud, 100 that is composed of at least two materials in a vertically layered orientation. In one embodiment, a vertically layered orientation is provided by forming a first conductive material, such as tungsten (W) stud 20, in a via, and then forming a second conductive material, such as copper (Cu) 35, within the via atop the first conductive material. In one embodiment, a conductive interface layer 36 is positioned between the first conductive material and the second conductive material. In one embodiment, the interface layer 36 is a multilayered structure that may include a tantalum nitride (TaN) layer positioned on the tungsten (W) stud 20, and a tantalum (Ta) layer positioned on the tantalum nitride (TaN) layer.

FIG. 1 depicts one embodiment of an interconnect dielectric layer 1 atop a substrate 2, such as a semiconducting wafer. In one embodiment, the present method may begin following front end of the line (FEOL) processing, in which an interconnect dielectric layer 1 is provided having a plurality of openings 10 that are filled with at least one conductive material, i.e. first conductive material, such as a metal stud, such as a tungsten (W) metal stud 20. In one embodiment, the metal stud 20 may provide electrical conductivity to a first terminal (source/drain) of a transistor (not shown) that is formed in the underlying substrate 2. In one embodiment, the interconnect dielectric layer 1 may also include at least one metal bar (not shown), wherein the metal bar is a conducting line that may be used to provide electrical conductivity to the second terminal (source/drain) of a transistor positioned in the underlying substrate 2. In one embodiment, the interconnect dielectric layer 1 may further include a lower conductive line (not shown). The lower conductive line may be a word line, which may bias the gate of the transistor that links the metal stud with the metal bar.

The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the doping of a Si-containing substrate may be light (having a dopant concentration of less than 1E17 atoms/cm$^3$) or heavy (having a dopant concentration of about 1E17 atoms/cm$^3$ or greater). The substrate 2 can have any crystallographic orientation such as (100), (110) or (111). Hybrid substrates having at least two planar surfaces of different crystallographic orientation are also contemplated.

In one embodiment, the interconnect dielectric layer 1 is formed atop the substrate 2 using a deposition process. More specifically, in one embodiment, an interconnect dielectric layer 1 is formed atop the substrate 2 by a deposition process that may include, chemical vapor deposition (CVD), evaporation, spin-on coating, or chemical solution deposition. Chemical Vapor Deposition is a deposition process in which a deposited species is formed as a result of a chemical reaction between gaseous reactants at greater than room temperature (25° C. to 600° C.); wherein solid product of the reaction is deposited on the surface on which a film, coating, or layer of the solid product is to be formed. Variations of CVD processes include, but are not limited to; Atmospheric Pressure CVD (APCVD), Low Pressure CVD (LPCVD) Plasma Enhanced CVD (EPCVD), Metal-Organic CVD (MOCVD) and combinations thereof may also be employed.

The interconnect dielectric layer 1 includes any suitable insulating material that is typically employed in interconnects to electrical devices. This includes inorganic dielectrics, organic dielectrics and combinations thereof, including, multilayers thereof. Illustrative examples of suitable materials for interconnect dielectric layer 1 include, but are not limited to: $SiO_2$, Boron Phosphorus Silicate Glass (BPSG), fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquioxane, methyl silsesquioxane, tetraethylorthosilicate (TEOS) and the like, amorphous alloys of Si, O, C and H, or amorphous alloys of Si, O, F and H. In one embodiment, the interconnect dielectric layer 1 is composed of a material having a dielectric constant greater than the first low-k dielectric layer 5.

After forming the interconnect dielectric layer 1 on a surface of the substrate 2, openings 10 are formed through the interconnect dielectric layer 1 so as to expose portions of the underlying substrate 2, in which interconnects, such as tungsten (W) studs 20, are subsequently formed. In one embodiment, the openings are provided with a circular cross section when viewed from the top view.

The openings 10, hereafter referred to as vias 10, are formed utilizing lithography and etching. For example, the lithographic step may include applying a photoresist to the interconnect dielectric layer 1, exposing the photoresist to a pattern of radiation and developing the pattern into the exposed photoresist utilizing a resist developer. The etching step used in providing the vias 10 into the interconnect dielectric layer 1 may include chemical reactive ion etching (RIE), plasma etching, ion beam etching, laser ablation or a combination thereof. Reactive ion etching (RIE) is a form of plasma etching in which the surface to be etched is placed on an RF powered electrode, wherein the surface to be etched takes on a potential that accelerates an etching species that is extracted from a plasma toward the surface to be etched, in which a chemical etching reaction is taking place in the direction normal to the surface. Following etching, the photoresist is typically removed from the structure utilizing a resist stripping process, such as oxygen ashing.

In one embodiment, metal studs, such as tungsten (W) studs 20, are then formed within the vias 10 in the interconnect dielectric layer 1 using deposition and planarization processes. In one embodiment, tungsten (W) is formed wherein the physical vapor deposition process may include the vias 10 utilizing a deposition process, such as physical vapor deposition, but is not limited to plating or sputtering. Sputtering includes bombardment of target with chemically inert ions that causes ejection of atoms from a target, wherein the ejected atoms deposited on the surface to be coated. In one embodiment, after filling the vias 10 with tungsten (W), the structure is subjected to a planarization process, such as chemical-mechanical polishing or grinding, to provide a structure having a planar upper surface, as depicted in FIG. 1.

Note that each top surface of the tungsten (W) studs 20, is substantially coplanar with the abutting top surface of interconnect dielectric layer 1.

In one embodiment, a barrier liner 19 is positioned between the tungsten (W) stud 20 and the via 10 sidewalls of the interconnect dielectric layer 1. In one embodiment, the barrier liner 19 may be composed of a metal nitride including but not limited to tungsten nitride (WN), tungsten silicon nitride (WSiN), tantalum nitride (TaN), tantalum aluminum nitride (TaAlN), and titanium aluminum nitride (TiAlN). In one embodiment, the barrier liner 19 may include a titanium (Ti) layer atop the substrate 2, and a titanium nitride (TiN) layer atop the titanium (Ti) layer, wherein the tungsten (W) stud 20 is formed of a tungsten layer (W) that is atop the titanium nitride (TiN) layer. In one embodiment, the barrier liner 19 is a substantially conformal layer. The term "conformal layer" denotes a layer having a thickness that does not deviate from greater than or less than 1%-50% of an average value for the thickness of the layer. In one embodiment, the barrier liner 19 may be deposited by physical vapor deposition (PVD), such as sputter deposition. In another embodiment, the barrier liner 19 may be deposited by chemical vapor deposition (CVD).

Figure 2:
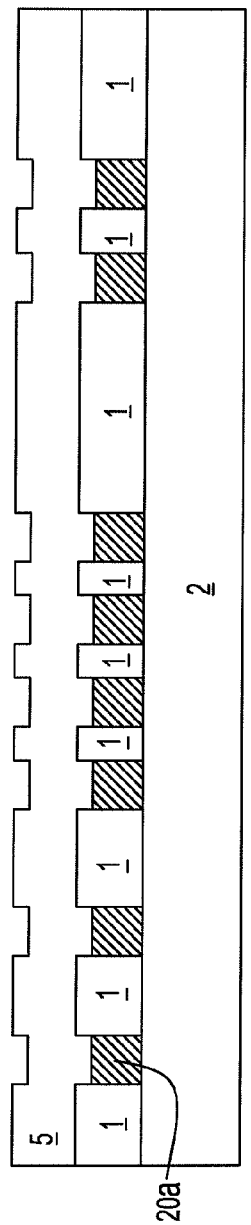
FIG. 2 is a side cross sectional view depicting recessing the upper surface of the tungsten (W) stud below the upper surface of the interconnect dielectric layer to provide a recessed tungsten (W) stud and forming a first low-k dielectric layer atop the recessed tungsten (W) stud, in accordance with one embodiment of the present invention.

FIG. 2 also depicts recessing the upper surface of the tungsten (W) stud 20 below the upper surface of the interconnect dielectric layer 1 to provide a recessed tungsten stud 20a. In one embodiment, the recessed tungsten (W) stud 20a provides the lower portion of the hybrid metal stud 100. In one embodiment, the step of recessing the upper surface of the tungsten (W) stud 20 below the upper surface of the interconnect dielectric layer 1 includes an etch process that etches the tungsten (W) stud 20 selective to boron phosphor silicate glass (BPSG) of the interconnect dielectric layer 1. In one embodiment, the tungsten (W) stud 20 is recessed selective to boron phosphor silicate glass (BPSG) by an anisotropic etch process. In one embodiment, the anisotropic etch process may be reactive ion etch (RIE). In one embodiment, the reactive ion etch process may have an etch chemistry including a fluorinated species, wherein the fluorinated species may include but is not limited to $C_4F_8$, $C_5F_8$, $C_4F_6$, or $NF_3$. In one embodiment, recessing the upper surface of the tungsten (W) studs 20 includes reactive ion etch processing with a sulfur hexafluoride/oxygen inductively coupled plasma having a density greater than about $10^{10}$ cm$^{-3}$ and having a flow ratio of about 4:1 sulfur hexafluoride to oxygen. An inductively coupled plasma is a high density plasma generated by an axial magnetic field that induces an electric field with circulation in the plane of the wafer and produces a plasma in which its density is decoupled from the ion energy at the substrate/electrode. In another embodiment, the reactive ion etch chemistry may be $NF_3Cl_2$.

In one embodiment, the upper surface of the tungsten (W) studs 20 is recessed about 10 nm to about 250 nm from the upper surface 15a of the interconnect dielectric layer 1. In another embodiment, the upper surface of the tungsten (W) studs 20 is recessed about 30 nm to about 100 nm from the upper surface 15a of the interconnect dielectric layer 1. In a further embodiment, the upper surface of the tungsten (W) studs 20 is recessed about 20 nm to about 50 nm from the upper surface of the interconnect dielectric layer 1.

FIG. 2 also depicts forming a first low-k dielectric layer 5 atop the interconnect dielectric layer 1 and the recessed tungsten (W) stud 20a, in accordance with at least one embodiment of the present invention. In one embodiment, the dielectric constant of the first low-k dielectric layer 5 may be less than about 3.5. In another embodiment, the first low-k dielectric layer 5 may have a dielectric constant that is from about 1.0 to about 3.0. Low-k dielectrics that are suitable for the first low-k dielectric layer 5 may include organic dielectrics such as low dielectric constant polymer dielectrics or may include low dielectric constant carbon-doped oxides. In one embodiment, the first low-k dielectric layer 5 may be composed of an aromatic hydrocarbon polymer composition. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH. In an even further embodiment, the first low-k dielectric layer 5 is provided by an oxygen doped glass. In one embodiment in which the interconnect dielectric layer 1 is composed of boron phosphor silicate glass (BPSG) oxide, the low-k dielectric layer 5 is composed of SiCOH.

In one embodiment, the first low-k dielectric layer 5 may be deposited on the interconnect dielectric layer 1 and the recessed tungsten stud 20a using a deposition process such as chemical vapor deposition (CVD), plasma enhanced chemical vapor deposition (PECVD), physical vapor deposition (PVD), high density plasma CVD (HDPCVD) or spin-on processes. In one embodiment, the first low-k dielectric layer 5 has a thickness ranging from about 10 nm to about 1000 nm.

Figure 3:
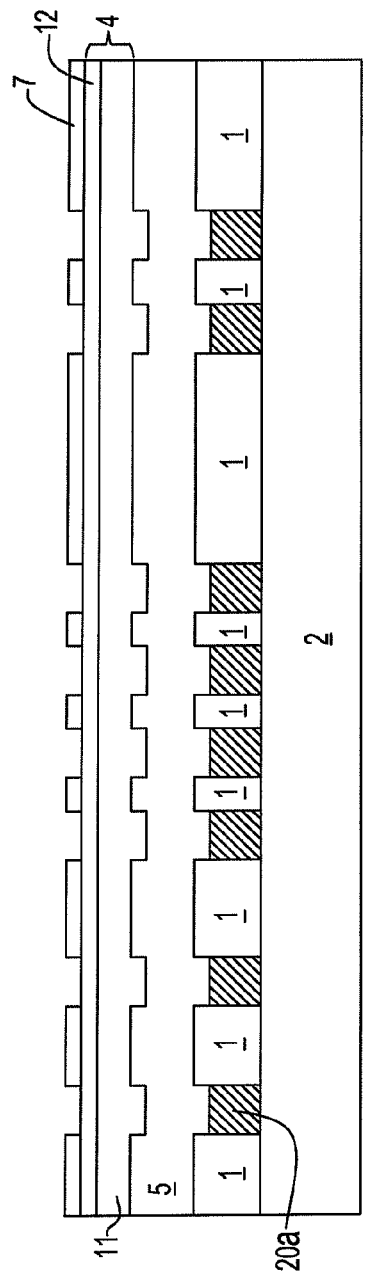
FIG. 3 is a side cross sectional view depicting patterning of a line level mask for forming a trench through the first low-k dielectric layer to expose the recessed tungsten (W) stud, in accordance with the present invention.

FIG. 3 depicts forming a layered stack 4 atop the first low-k dielectric layer 5, and providing a block mask 7 for forming a via 10 through the first low-k dielectric layer 5 to expose an upper surface of the recessed tungsten stud 20a, in accordance with one embodiment of the present invention. Layer stack 4 may be used to compensate for the topography of film 5. More specifically, layer stack 4 may be processed to provide a planar upper surface to the structure underlying the block mask 7 that is depicted in FIG. 3.

The second low-k dielectric layer 11 may be composed similar materials, as the first low-k dielectric layer 5, which are described above. In one embodiment, the second low-k dielectric layer 11 is composed of diamond like carbon (DLC), which may also be referred to as near frictionless carbon (NFC). In one embodiment, the second low-k dielectric layer 11 is deposited by chemical vapor deposition (CVD), physical vapor deposition (PVD), or a combination thereof. In one embodiment, the second low-k dielectric layer 11 may have a thickness ranging from about 10 nm to about 1000 nm.

In one embodiment, in a following process step, the second low-k dielectric layer 11 may be planarized to provide a planar upper surface. Planarization is a material removal process that employs at least mechanical forces, such as frictional media, to produce a planar surface. In one embodiment, the second low-k dielectric layer 11 may be planarized by chemical mechanical planarization (CMP). CMP is a material removal process using both chemical reactions and mechanical forces to remove material and planarize a surface.

Still referring to FIG. 3, in one embodiment, an insulator 12 of the layered stack 4 may be an oxide, nitride or oxynitride. In one embodiment, the insulator 12 may be formed on an upper surface of the second low-k dielectric layer 11 using thermal oxidation or nitridation. In another embodiment, the insulator 12 may be deposited as a layer atop the upper surface of the second low-k dielectric layer 11. In one embodiment, the insulator 12 may be an oxide, such as $SiO_2$, that is formed on an upper surface of the second low-k dielectric layer 11 by low temperature thermal oxidation. In one embodiment, the insulator 12 may have a thickness ranging from about 10 nm to about 1000 nm.

Figure 4:
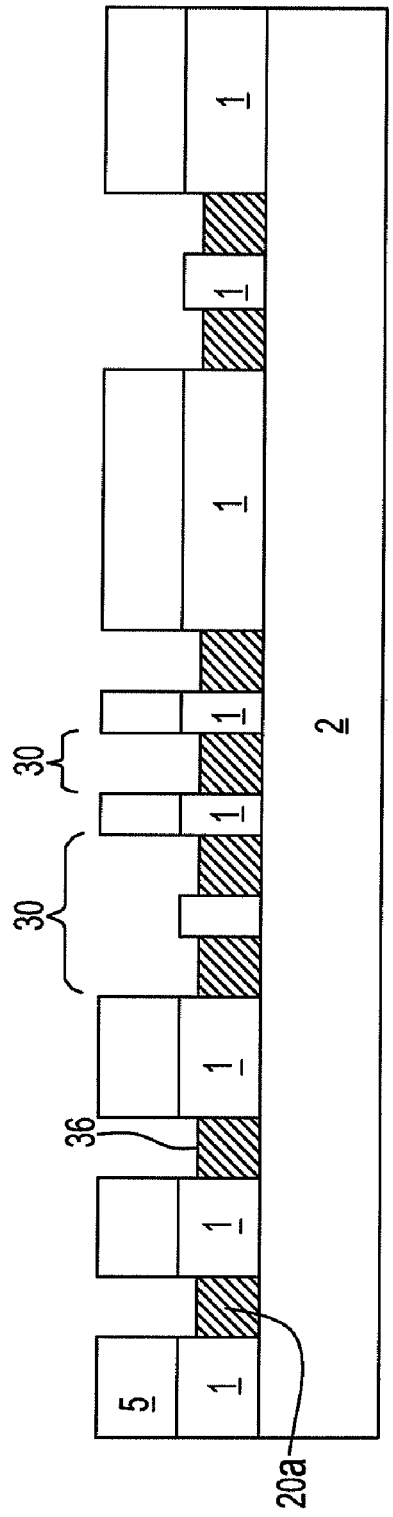
FIG. 4 is a side cross sectional view depicting forming a trench through the first low-k dielectric layer to expose the recessed tungsten (W) stud, in accordance with one embodiment of the present invention.

Referring FIGS. 3 and 4, in a subsequent process step, the layered stack 4 and the underlying first low-k dielectric layer 5 are patterned and etched to provide an opening 30, hereafter referred to as via 30, exposing the recessed metal stud 20a. In one embodiment, the layered stack 4 is patterned using a block mask 7. In one embodiment, the block mask 7 may be composed of a dielectric material, which may be spin applied to the upper surface of the layered stack 4. In one embodiment, an anti-reflective coating (ARC) (not shown) may be spin applied to the upper surface of the insulator 12 of the layered stack 4 and baked before the dielectric of the block mask 7 is deposited. Alternatively, the anti-reflective coating (ARC) may be omitted. The block mask 7 is patterned to expose the portion of the layered stack 4 that is overlying the recessed tungsten (W) stud 20a by applying a layer of photoresist to the surface of the block mask dielectric to be etched; exposing the layer of photoresist to a pattern of radiation; and then developing the pattern into the photoresist utilizing a resist developer. Once the patterning of the photoresist is completed, the sections covered by the photoresist are protected, while the exposed regions are removed using a selective etching process that removes the unprotected regions. In one embodiment, following photoresist patterning and development, the exposed portions of the layered stack 4 and underlying low-k dielectric layer 5 are etched using an anisotropic etch process, i.e., reactive ion etch, selective to the recessed tungsten (W) stud 20a. The resist is then removed using a conventional chemical strip.

More specifically, in one embodiment, in a first etch step the insulator 12 is etched selective to the second low-k dielectric layer 11. In a second etch step, the second low-k dielectric layer 11 is etched selective to the recessed tungsten (W) stud 20a. In one embodiment, the first and second etch step may be a timed etch, in which the duration of the first and second etch steps may be determined by end point detection. In another embodiment, the block mask 7 may be a hard mask provided by a dielectric that provides etch selectivity to at least the insulator 12.

In one embodiment, following the formation of the vias 30 through the first low k dielectric layer 5 to expose the recessed tungsten (W) stud 20a, the layered stack 4 and the block mask 7 are removed to expose the upper surface of the first low-k dielectric layer 5, as depicted in FIG. 4. In one embodiment, the block mask 7 may be stripped using a chemical strip process including, but not limited to oxygen ashing. In one embodiment, the layered stack 4 may be removed by a planarization process, such as chemical mechanical planarization (CMP). In another embodiment, the layered stack 4 may be removed by an etch process selective to the recessed tungsten (W) stud 20a.

Figure 5:
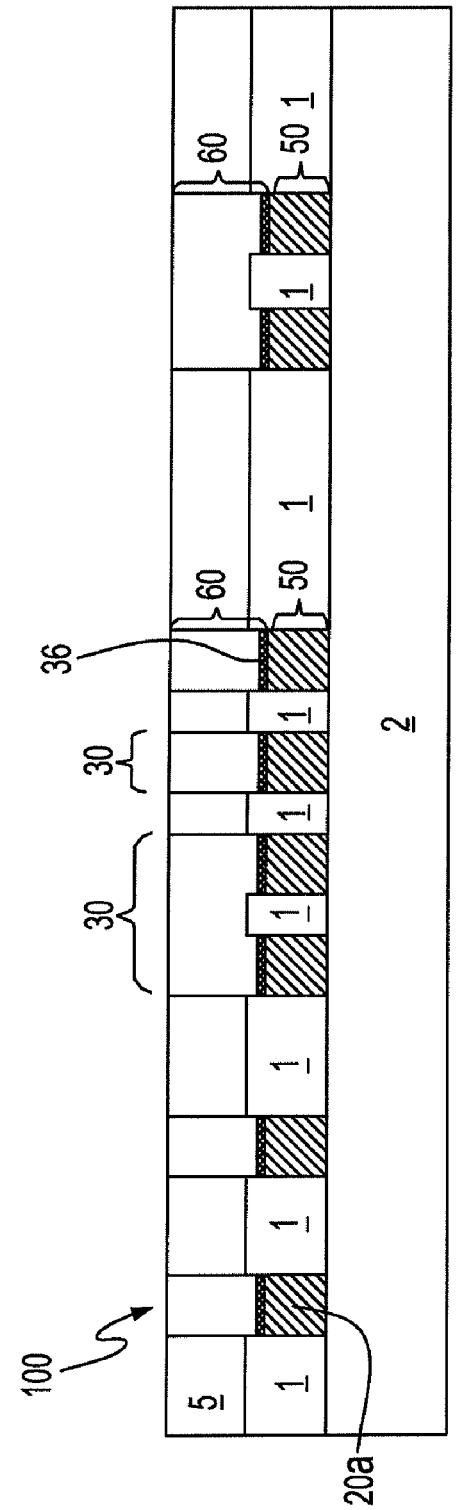

FIG. 5 depicts one embodiment of the formation of the upper portion 60 of the hybrid metal stud 100. In one embodiment, the upper portion 60 of the hybrid metal stud 100 is composed of copper (Cu). In one embodiment, the copper (Cu) 35 is deposited atop the recessed tungsten (W) stud 20a, wherein the copper (Cu) 35 formed within the via 30 atop the recessed tungsten (W) stud 20a provides an upper portion 60 of the hybrid metal stud 100. In one embodiment, the upper portion 60 of the hybrid metal stud 100 extends from the upper surface of the hybrid metal stud to the interface of the copper (Cu) 35 and recessed tungsten (W) stud 20a. In one embodiment, a conductive interface layer 36 is provided at the interface of the copper (Cu) 35 and the recessed tungsten (W) stud 20a. In one embodiment the conductive interface layer 36 is a multilayered structure including a tantalum nitride (TaN) layer atop the recessed tungsten (W) stud 20a, and a tantalum (Ta) layer atop the tantalum nitride (TaN) layer. In one embodiment, the lower portion 50 of the hybrid metal stud 100 extends from the interface of the copper 35 and the recessed tungsten (W) stud 20a and terminates at the substrate 2.

In one embodiment, copper (Cu) 35 is deposited atop the upper surface of the recessed tungsten (W) stud 20a to at least fill the via 30 formed through the first low k dielectric layer 5.

In one embodiment, the copper (Cu) 35 is deposited by physical vapor deposition (PVD) including, but not limited to sputtering or plating. In another embodiment, the copper (Cu) 35 is deposited by chemical vapor deposition (CVD). In one embodiment, the copper (Cu) 35 that is deposited in the via 30 extends to the upper surface of the first low-k dielectric layer 5. In one embodiment, the copper (Cu) 35 that is positioned on the upper surface of the first low-k dielectric layer 5 is removed by a planarization process, wherein the upper surface of the copper (Cu) 35 within the via 30 is coplanar with the upper surface of the first low-k dielectric layer 5. FIG. 6 depicts the copper (35) present in the via 30.

In one embodiment when a conductive interface layer 36 is present at the interface of the upper portion 60 and the lower portion 50 of the hybrid metal stud 100, the conductive interface layer 36 may be a multi-layered structure that includes a tantalum nitride (TaN) layer and a tantalum (Ta) layer. In one embodiment, the tantalum nitride (TaN) layer is deposited atop the tungsten (W) stud using at least one of physical vapor deposition (PVD), ionized physical vapor deposition (IPVD), and atomic layer deposition (ALD), wherein the tantalum nitride (TaN) layer may have a thickness ranging from about 40 Å to 100 Å. In one embodiment, following the formation of the tantalum nitride (TaN) layer, a tantalum (Ta) layer is then deposited atop the tantalum nitride (TaN) layer using at least one of physical vapor deposition (PVD), ionized physical vapor deposition (IPVD) and atomic layer deposition (ALD), wherein the tantalum (Ta) layer may have a thickness ranging from about 40 Å to 100 Å. In a following process step, a copper (Cu) seed layer may then be deposited atop the tantalum (Ta) layer. In one embodiment, the copper (Cu) seed layer is sputtered to a thickness ranging from about 100 Å to 200 Å. In one embodiment, vias 30 are then filled with copper (Cu) by electroplating, wherein the upper surface of the copper (Cu) 35 within the via 30 may be planarized to be coplanar with the upper surface of the first low-k dielectric layer 5.

FIG. 7 depicts another embodiment of the formation of copper (Cu) 35 atop the recessed tungsten (W) stud 20a. In one embodiment, prior to the copper (Cu) 35 formation, an isotropic etch is applied to the sidewalls of the via 30 at the interconnect dielectric 1. In one embodiment, the isotropic etch removes the interconnect dielectric 1 selective to the first low-k dielectric 5 to provide an undercut region 80, which may also be referred to as recess 80, that extends from the via 30 into the interconnect dielectric and underlies the low-k dielectric 5. In one embodiment, the isotropic etch is a wet etch. In one embodiment, in which the interconnect dielectric 1 is composed of boron phosphor silicate glass (BPSG) oxide and the first low-k dielectric 5 is composed of SiCOH, the isotropic etch may include a wet etch composed of HF diluted with distilled water. In one embodiment, the wet etch may be composed of a diluted HF ranging from about 200:1 to about 600:1.

In one embodiment, the undercut region 80 has a sidewall etched into the interconnect dielectric 1 having a curvature geometry. In one embodiment, the width W1 of the undercut region 80 may range from about 10 nm to about 20 nm. In another embodiment, the width W1 of the undercut region 80 may range from about 3 nm to about 10 nm. In yet another embodiment, the width W1 of the undercut region 80 may range from about 1 nm to about 3 nm.

Still referring to FIG. 7, in one embodiment, following the formation of the undercut region 80, the upper portion 60 of the hybrid metal stud 100 is then formed using similar methods and compositions to those described above with reference to FIG. 5. For example, in one embodiment, a copper (Cu) upper portion 60 is provided atop the recessed tungsten (W) stud 20a. In one embodiment, a conductive interface layer 36 may be positioned between the upper portion 60 and the lower portion 50 of the hybrid metal stud 100. In one embodiment, the conductive interface layer 36 is a multilayered structure including a tantalum nitride (TaN) layer atop the tungsten (W) stud 20a, and a tantalum (Ta) layer atop the tantalum nitride (TaN) layer. In one embodiment, a copper (Cu) seed layer is present atop the tantalum (Ta) layer. In one embodiment, an extension 37 of copper (Cu) from the upper portion 60 of the hybrid metal stud 100 is positioned in the recess 80 and contacts a sidewall of the lower portion of the hybrid metal stud 100.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of forming an interconnect comprising:
providing an interconnect dielectric layer atop a substrate, the interconnect dielectric layer including at least one stud consisting of tungsten (W) extending from an upper surface of the interconnect dielectric layer to the substrate;
recessing an upper surface of the at least one stud below the upper surface of the interconnect dielectric layer to provide at least one recessed stud;
forming a first low-k dielectric layer atop the upper surface of the interconnect dielectric layer and the at least one recessed stud;
depositing a second low-k dielectric layer atop an upper surface of the first low-k dielectric layer;
forming a thermal oxide atop the second low-k dielectric layer;
forming a block mask atop the thermal oxide exposing a portion of the thermal oxide overlying the recessed stud;
etching the portion of the thermal oxide that is exposed by the block mask selective to the second low-k dielectric layer with an anisotropic etch step;
etching the second low-k dielectric layer selective to the upper surface of the at least one recessed stud to provide an opening to expose an upper surface of the at least one recessed stud;
applying an isotropic etch through the opening to remove a portion of the interconnect dielectric layer selective to the first low-k dielectric layer; and
filling the opening with copper (Cu).

2. The method of claim 1, wherein the interconnect dielectric layer is composed of silicon oxide ($SiO_2$), Boron Phosphor Silicate Glass (BPSG) oxide, fluorinated silicon oxide ($SiO_2$), silicon nitride ($Si_3N_4$), silicon carbide (SiC), organosilicate glass (OSG), hydrogen silsesquixoane, methyl silsesquixoane, tetraethylorthosilicate (TEOS), silicon oxynitride ($SiO_xN_y$) or combinations thereof.

3. The method of claim 1, wherein the recessing of the upper surface of the at least one stud comprises an anisotropic etch step comprised of a fluorinated species.

4. The method of claim 1, wherein the recessing of the upper surface of the at least one stud comprises a wet etch.

5. The method of claim 4, wherein the wet etch comprises $H_2O_2$ or a persulfate containing composition.

6. The method of claim 1, wherein the first low-k dielectric layer has a dielectric constant ranging from about 1.0 to about 3.0.

7. The method of claim 1, wherein forming the first low-k dielectric layer comprises a CVD, PECVD, PVD, high-density plasma CVD or spin-on glass process.

8. The method of claim 1, wherein the first low-k dielectric layer has a thickness ranging from about 10 nm to about 1000 nm.

9. The method of claim 1, wherein the first low-k dielectric layer comprises carbon doped oxides.

10. The method of claim 1, wherein the first low-k dielectric layer comprises SiCOH, an aromatic hydrocarbon polymer composition or a combination thereof.

11. The method of claim 1, wherein the second low-k dielectric layer comprises diamond like carbon (DLC).

12. The method of claim 1 wherein filling the opening with copper (Cu) comprises sputtering.

13. A method of forming an interconnect comprising:
    providing an interconnect dielectric layer atop a substrate, the interconnect dielectric layer including at least one stud consisting of tungsten (W) extending from an upper surface of the interconnect dielectric layer to the substrate;
    recessing an upper surface of the at least one stud below the upper surface of the interconnect dielectric layer to provide at least one recessed stud;
    forming a first low-k dielectric layer atop the upper surface of the interconnect dielectric layer and the at least one recessed stud;
    forming an opening through the first low-k dielectric layer to expose an upper surface of the at least one recessed stud;
    applying an isotropic etch through the opening to remove a portion of the interconnect dielectric layer selective to the first low-k dielectric layer to provide an undercut region; and
    filling the opening with copper (Cu), wherein a portion of the copper (Cu) that fills the undercut region provides an extension of copper (Cu) that is in contact with a sidewall of the at least one recessed stud.

14. The method of claim 13, wherein the forming of the opening through the first low-k dielectric layer to expose the upper surface of the at least one recessed stud further comprises:
    depositing a second low-k dielectric layer atop an upper surface of the first low-k dielectric layer;
    forming a thermal oxide atop the second low-k dielectric layer;
    forming a block mask atop the thermal oxide exposing a portion of the thermal oxide overlying the recessed stud;
    etching the exposed portion of the thermal oxide selective to the second low-k dielectric layer with an anisotropic etch step; and
    etching the second low-k dielectric layer selective to the upper surface of the at least one recessed stud.

15. The method of claim 13, wherein the interconnect dielectric layer is composed of silicon oxide ($SiO_2$), Boron Phosphor Silicate Glass (BPSG) oxide, fluorinated silicon oxide ($SiO_2$), silicon nitride ($Si_3N_4$), silicon carbide (SiC), organosilicate glass (OSG), hydrogen silsesquixoane, methyl silsesquixoane, tetraethylorthosilicate (TEOS), silicon oxynitride ($SiO_xN_y$), or combinations thereof.

16. The method of claim 13, wherein the recessing of the upper surface of the at least one stud comprises an anisotropic etch step comprised of a fluorinated species.

17. The method of claim 13, wherein the recessing of the upper surface of the at least one stud comprises a wet etch.

18. The method of claim 17, wherein the wet etch comprises $H_2O_2$ or a persulfate containing composition.

19. The method of claim 13, wherein the first low-k dielectric layer comprises SiCOH, an aromatic hydrocarbon polymer composition or a combination thereof and the second low-k dielectric layer comprises diamond like carbon (DLC).

* * * * *